(12) United States Patent
Liu (10) Patent No.: US 7,830,470 B2
(45) Date of Patent: Nov. 9, 2010

(54) BACKLIGHT MODULE

(75) Inventor: Keng-Ju Liu, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 149 days.

(21) Appl. No.: 12/277,597

(22) Filed: Nov. 25, 2008

(65) Prior Publication Data

US 2009/0168402 A1     Jul. 2, 2009

(30) Foreign Application Priority Data

Dec. 28, 2007  (TW) .............................. 96150786 A (51) Int. Cl.
*G02F 1/1333*     (2006.01)
(52) U.S. Cl. .................... 349/58; 362/633; 362/97.2
(58) Field of Classification Search ............... 349/58, 349/60, 62; 362/632–634, 97.1, 97.2, 97.4
See application file for complete search history.

(56) References Cited

U.S. PATENT DOCUMENTS 7,746,420 B2 *  6/2010  Chang ....................... 349/60
2006/0232999 A1 10/2006 Chang et al.
2009/0310054 A1 * 12/2009 Shin et al. ................. 349/58

FOREIGN PATENT DOCUMENTS

JP        2006-164521        6/2006

OTHER PUBLICATIONS

English language translation of abstract of TW 94146287.
Chinese language office action dated Nov. 20, 2009.
English language translation of pertinent parts of JP 2006-164521 (published Jun. 22, 2006).

* cited by examiner

*Primary Examiner*—Sarah Hahm
(74) *Attorney, Agent, or Firm*—Thomas, Kayden, Horstemeyer & Risley, LLP (57) ABSTRACT

The present invention discloses a backlight module. The backlight module of the present invention includes a frame, a flexible circuit board, a light emitting unit, and a light guide plate. The frame has a bottom surface, an inner sidewall adjacent and perpendicular to the bottom surface, and a protrusion unit. Protrusion unit protrudes from the inner sidewall and is parallel to the bottom surface. The flexible circuit board is disposed beneath the protrusion unit and electrically connected to the light emitting unit. The light guide plate is disposed on the bottom surface and is adjacent to the light emitting unit. Furthermore, the protrusion unit is disposed at the corner of the two adjacent inner sidewalls of the frame, and a substrate presses the protrusion unit which further presses the flexible circuit board, and thus the flexible circuit board and the light emitting unit connected thereto can be fixed in the frame.

12 Claims, 7 Drawing Sheets

BACKLIGHT MODULE

BACKGROUND OF THE INVENTION

1. Field of the Invention

This invention relates to a structure of backlight module; more particularly, this invention relates to a structure of backlight module used in a display device.

2. Description of the Prior Art

Display devices have been widely applied to a variety of electronic devices, such as televisions, computers, mobile phones and personal digital assistants (PDA). There are more and more needs for the display device having the advantages of lightness, power saving and low radiation; moreover, the backlight modules that use LEDs as the light source have the advantages mentioned above, and are now commonly applied to small size display devices and thus the market continues to expand.

Currently, in the manufacturing methodology of the LED backlight module and the display device thereof, the LED is fixed to the flexible circuit board by mounting or pressing; the flexible circuit board is fixed in the frame in which the backlight module is disposed, or fixed to the light guiding plate. Generally, the flexible circuit board can be fixed in the frame by using adhesives, such as double sided tapes, tapes, or other types of adhesive. However, such conventional and common methodology has some flaws. For example, the adhesive (for example, double sided tape) between the flexible circuit board and the frame (or light guiding board) does not stick well and creates slits or cause the flexible circuit board to bend upwards, so that the light of the LED light source is emitted outside the light guiding plate which causes light leakage. Light leakage decreases the utilization rate of the LED light source, and further reduces the brightness of the display device. Therefore, improved disposition of the flexible circuit board having LEDs in the frame of the backlight module to ensure the utilization rate of the LED light source, and the prevention of light leakage has become one of the important issues which needs to be improved in LED backlight module.

SUMMARY OF THE INVENTION

An object of this invention is to provide a backlight module, onto which the light source can be fixed to effectively prevent light leakage.

Another object of this invention is to provide a backlight module which can be used to efficiently increase the utilization rate of the light source.

The backlight module of this invention includes a frame, a flexible circuit board, a light emitting unit and a light guiding plate. The frame comprises a bottom surface, an inner sidewall which is adjacent to and perpendicular to the bottom surface, and a protrusion unit. The protrusion unit protrudes from the inner sidewall and is parallel to the bottom surface. The flexible circuit board extends along the bottom surface of the frame and is disposed beneath the protrusion unit. What needs to be noted is that the protrusion unit is contact and on the flexible circuit board.

DETAILED DESCRIPTION OF THE PREFERRED EMBODIMENT

In a preferred embodiment, this invention provides a backlight module that can efficiently improve the utilization rate of light source. The backlight module of this invention can be applied to all kinds of electronic products, including the display device of the consumer electronic products, such as liquid crystal display televisions, liquid crystal displays, or the displays of mobile phones or electronic watches.

Figure 1:
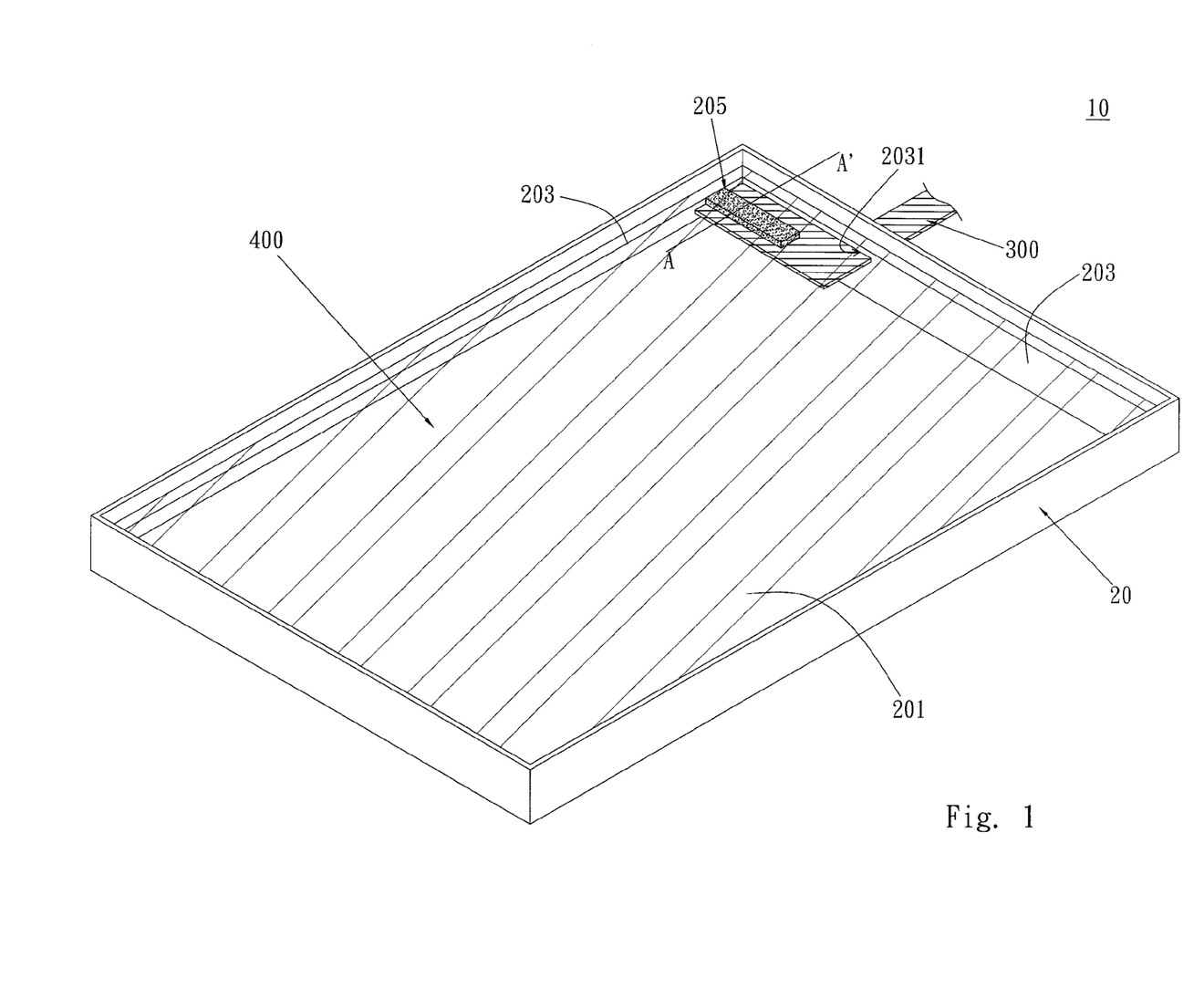
FIG. 1 is the three-dimensional perspective view of a backlight module embodiment of this invention.

Please refer to FIG. 1, which is the three-dimensional perspective view of the main structure of a backlight module 10 of an embodiment of the present invention. The backlight module 10 includes a frame 20. The frame 20 includes a bottom surface 201, an inner sidewall 203 and a protrusion unit 205. The inner sidewall 203 extends away from the bottom surface 201; specifically, the inner sidewall 203 is the plane that is perpendicular to the bottom surface 201. Moreover, the protrusion unit 205 is formed on the inner sidewall 203 and protrudes out from the inner sidewall 203. More particularly, the protrusion unit 205 is connected to the inner sidewall 203 and is parallel to the bottom surface 201. In greater details, the protrusion unit 205 comprises a top contact surface 2051 and a corresponding bottom contact surface 2052, and the bottom contact surface 2052 is the surface that faces the bottom surface 201 (please refer to FIG. 2). The frame 20 is generally a rectangular frame used to accommodate the backlight module 10 and to assemble with the housing of the display device. Generally, the frame 20 of this invention is made of plastic, and the protrusion unit 205 is preferably a flexible element made of flexible material, such as plastic materials. Moreover, the protrusion unit 205 is preferably made in one piece with the frame 20 by injection molding, or the protrusion unit 205 and the frame 20 can be separate elements and the protrusion unit 205 is connected to the frame 20 through assembling.

Please continue to refer to FIG. 1, the backlight module 10 of this invention further comprises a flexible circuit board 300 disposed inside the frame 20. As illustrated in FIG. 1, the flexible circuit board 300 is a strip-shaped slice flexible circuit board 300 disposed inside the frame 20, and extends along the bottom surface 201 of the frame 20. Moreover, the flexible circuit board 300 can project from the frame 20 through the hole 2031 of the inner sidewall 203. The flexible circuit board 300 is disposed beneath the protrusion unit 205 and in contact with the bottom contact surface 2052 of the protrusion unit 205. The flexible circuit board 300 is disposed beneath the protrusion unit 205, and in contact with the bottom contact surface 2052 of the protrusion unit 205. The flexible circuit board 300 provides the electrical signal to the light source of the backlight module 10, and the light source of the backlight module 10 has different responds in accordance with different electrical signals. In the embodiment illustrated by FIG. 1, the present invention further comprises a substrate 400 disposed inside the frame 20, and located on the protrusion unit 205; the substrate 400 is preferably in contact with the top contact surface 2051 of the protrusion unit 205. Generally, substrate 400 is preferably made of glass material and is used as the light emitting plane of the backlight module 10. However, other light transmission materials can also be used as the material for making the substrate 400.

Figure 2:
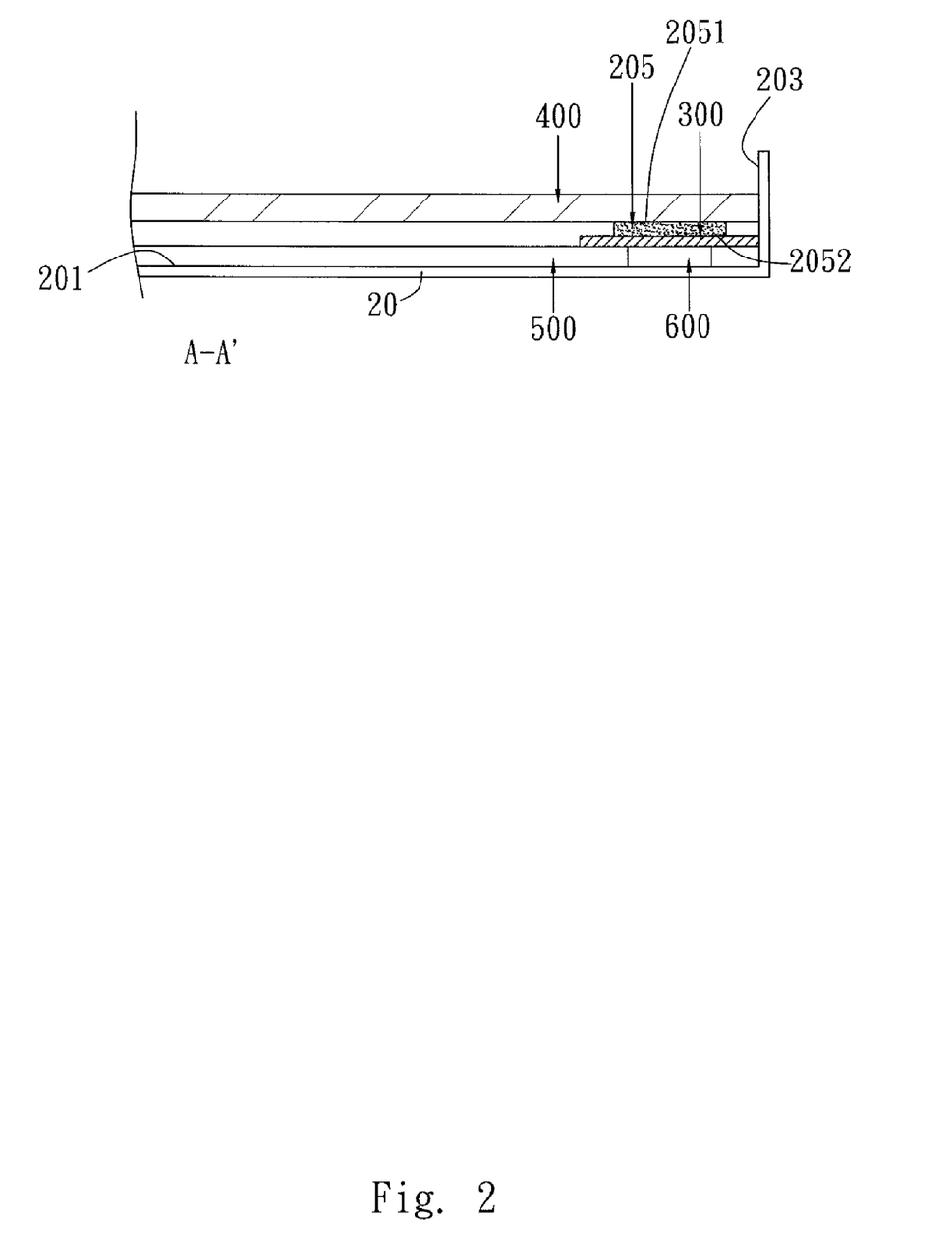
FIG. 2 is the side cross-sectional view of FIG. 1 as seen from tangent A-A'.

FIG. 2 is the cross-sectional view of the backlight module 10 shown by FIG. 1. The cross-sectional view shown by FIG. 2 is corresponding to the tangent A-A' marked in FIG. 1. As can be seen from the FIG. 2, the substrate 400 is disposed on and contacts with the top contact surface 2051 of the protrusion unit 205, and the bottom contact surface 2052 of the protrusion unit 205 contacts with the flexible circuit board 300; moreover, because the substrate 400 has weight and thus the protrusion unit 205 can further be compelled to press on the flexible circuit board 300 beneath the protrusion unit 205. The above embodiments of this invention further comprise a light guiding plate 500 and a light emitting element 600 disposed in the frame 20. The light guiding plate 500 is disposed between the bottom surface 201 of the frame 20 and the flexible circuit board 300. In the preferred embodiment, the light guiding plate 500 covers almost the entire bottom surface 201. The light emitting element 600 is disposed on the bottom surface 201 adjacent to the inner sidewall 203, and the light-emitting element 600 is fixed to the flexible circuit board 300 and is also electrically connected to the flexible circuit board 300. The light-emitting element 600 is preferably an LED or other light sources which emitting the corresponding light responded to the according electrical signals received from the flexible circuit board 300. The light emitting element 600 is preferably fixed to the side of the flexible circuit board 300 that faces the bottom surface 201. The fixation methodology can be, for example, soldering or pressing. Furthermore, the position where the light-emitting element 600 is fixed to the flexible circuit board 300 is corresponding to the place where the protrusion unit 205 is compelled to press on the flexible circuit board 300. Furthermore, the light-emitting element 600 is adjacent to the light guiding plate 500, such that the light guiding plate 500 can receive the light source from the light-emitting element 600, and further evenly distribute the light.

Figure 3A:
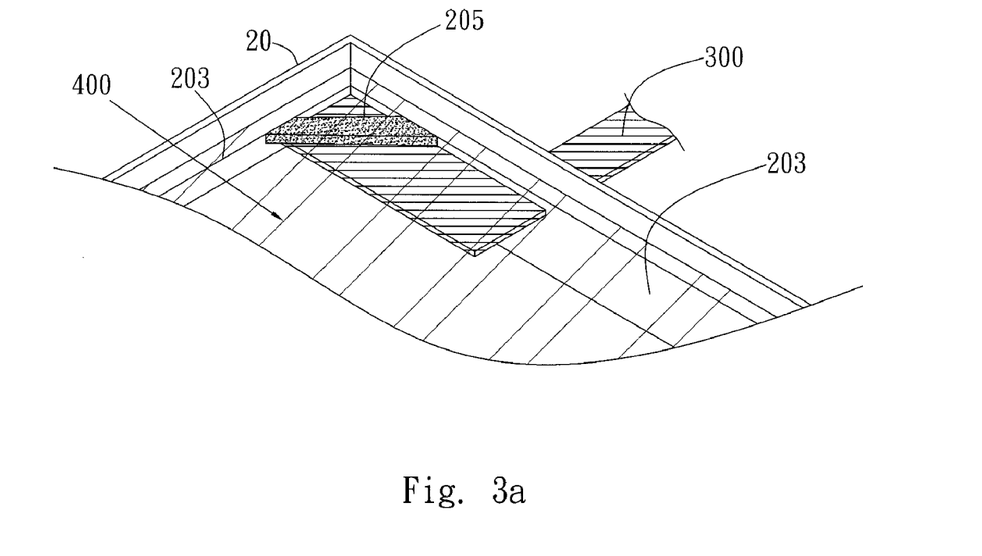
FIG. 3*a* schematically a partial perspective view of the backlight module of an embodiment of this invention.
Figure 3B:
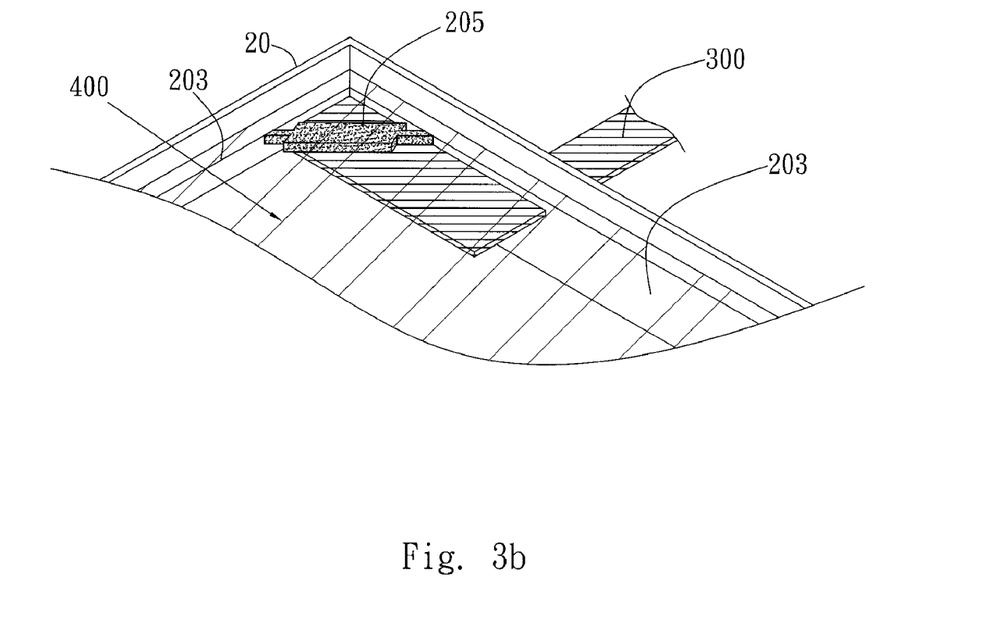
FIG. 3*b* schematically illustrates a partial perspective view of the backlight module of yet another embodiment of this invention.

The above embodiments illustrated by FIG. 1, the protrusion unit 205 is a horizontal beam structure, one end of the protrusion unit 205 protrudes from the inner sidewall 203, and the other end is not connected to the inner sidewall and is suspended in midair to form a cantilever. Generally, the protrusion unit 205 is parallel to the bottom surface 201 of the frame 20 and the flexible circuit board 300. However, in other embodiments illustrated by FIG. 3a to 3f, the protrusion unit 205 may have other figures or may be disposed in other ways. As illustrated by FIG. 3a, the protrusion unit 205 that has a horizontal beam structure is preferably connected to the adjacent inner sidewalls 203. In particular, the corners where the protrusion unit 205 and the two adjacent inner sidewalls 203 construct a triangular space; in other words, the angles between the protrusion unit 205 and the two inner sidewalls 203 are all not right angles. In another preferred embodiment, please refer to FIG. 3b, the protrusion unit 205 that has horizontal beam structure is preferably connected to the two adjacent inner sidewalls 203; The differences from other embodiments is that the protrusion unit 205 of the embodiment is wide in the middle and narrow on the two ends, and the structure design can give more flexibility or elasticity to the protrusion unit 205, such that the protrusion unit 205 can be better compelled to press on the flexible circuit board 300 after receiving the force.

Figure 3C:
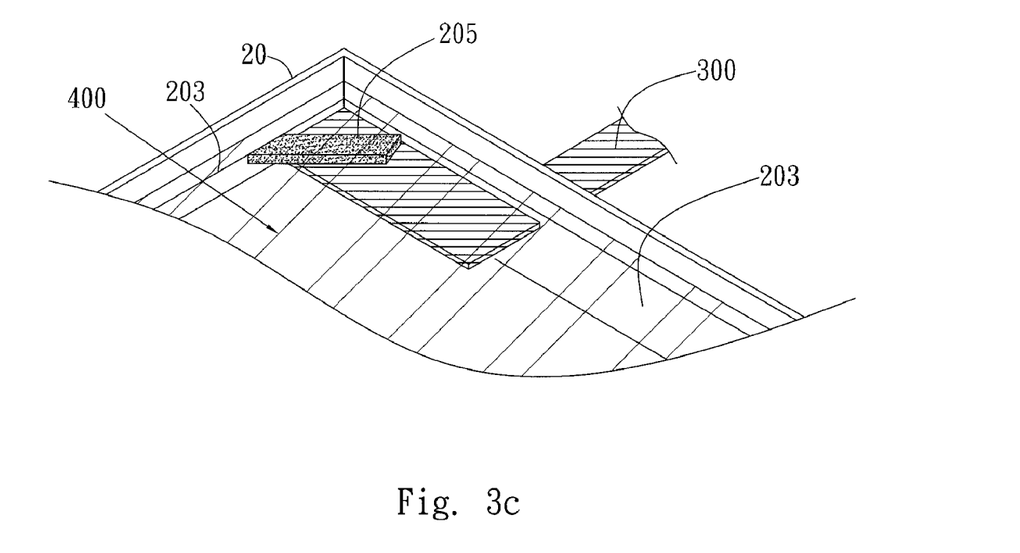
FIG. 3*c* schematically illustrates a partial perspective view of the backlight module of another embodiment of this invention.
Figure 3D:
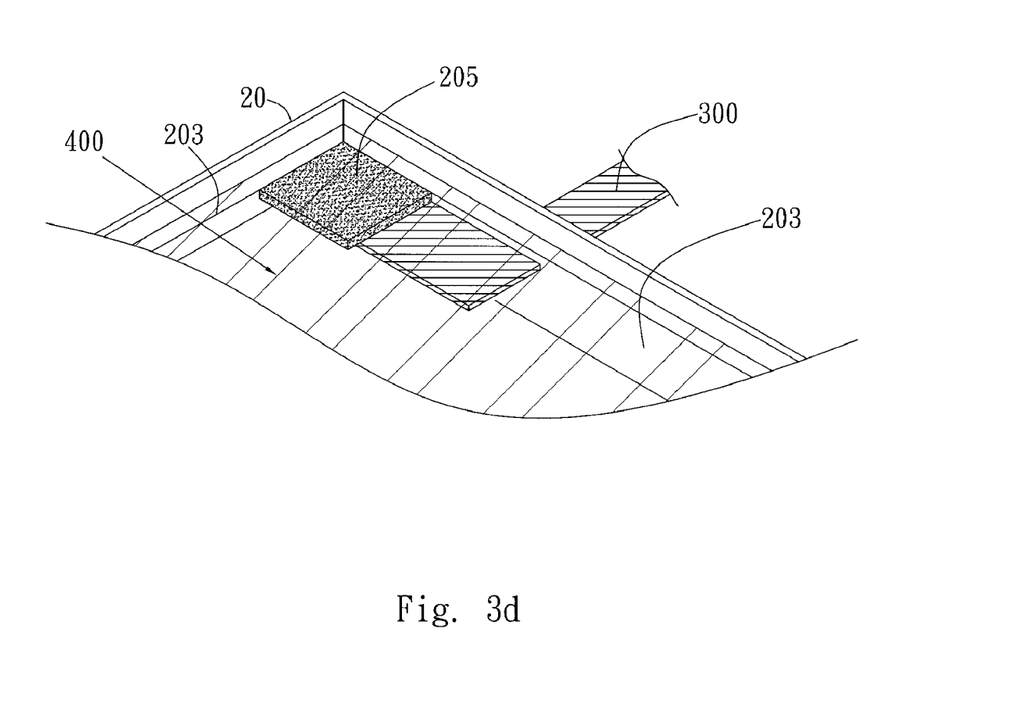
FIG. 3*d* schematically illustrates a partial perspective view of the backlight module of another embodiment of this invention.
Figure 3E:
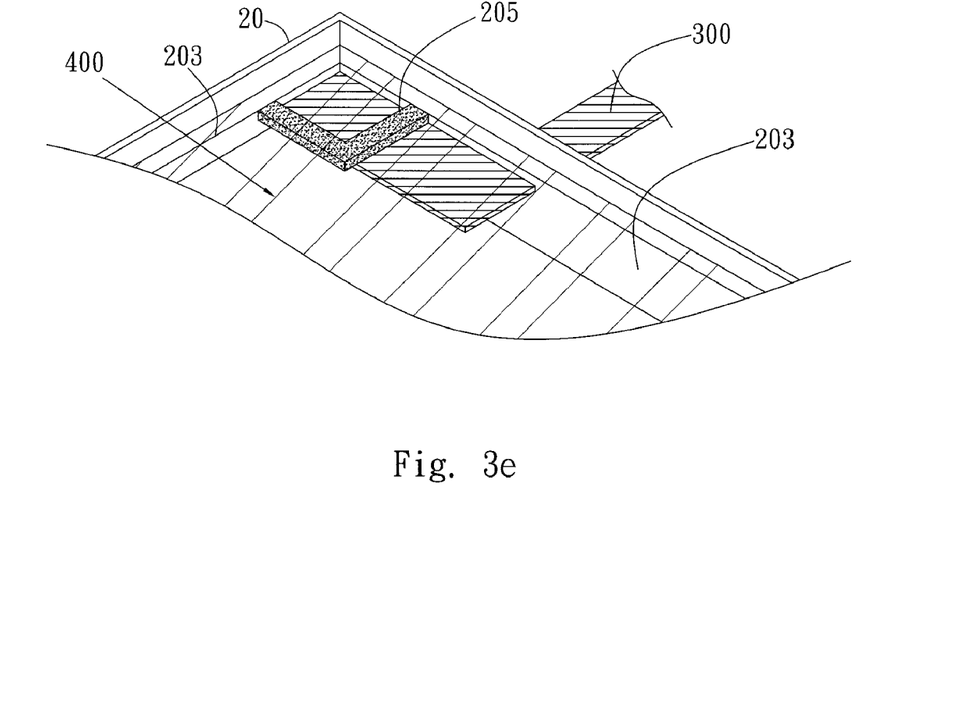
FIG. 3*e* schematically illustrates a partial perspective view of the backlight module of another embodiment of this invention.
Figure 3F:
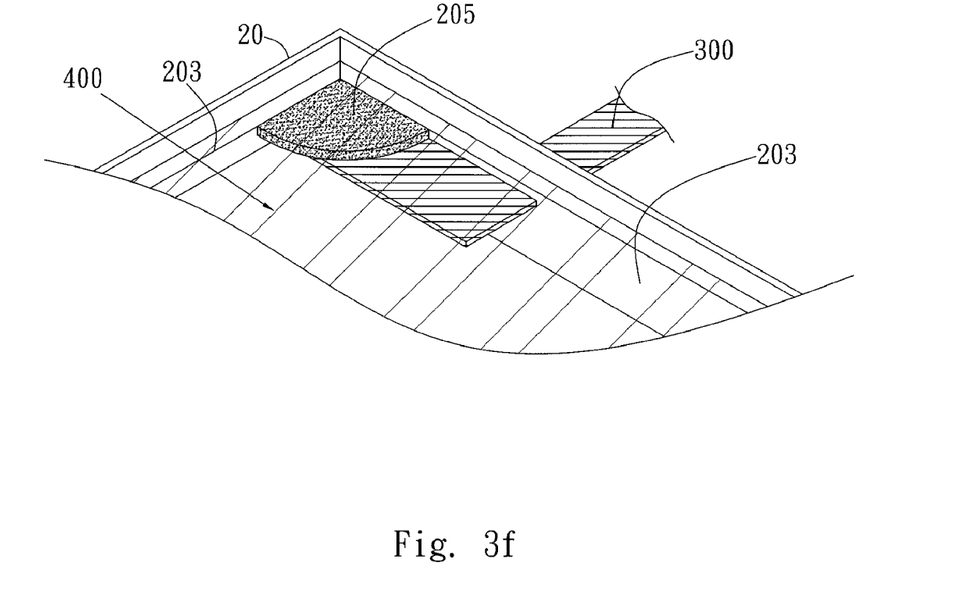
FIG. 3*f* schematically illustrates a partial perspective view of the backlight module of another embodiment of this invention.

FIG. 3c illustrates another embodiment of this invention, and one end of the protrusion unit 205 that protrudes out from the inner sidewall 203 is not perpendicular to the inner sidewall 203; moreover, the other end of the protrusion unit 205 is suspended in midair and form a oblique cantilever. FIG. 3d illustrates another embodiment of this invention, and the protrusion unit 205 is the slice rectangular structure, and the two sidewalls of the slice rectangular structure are respectively connected to the two adjacent inner sidewalls 203 of the frame 20. The protrusion unit 205, in another embodiment illustrated by FIG. 3e is structured in the shape of L-shaped horizontal beam, and the two ends of the protrusion unit 205 are respectively connected to the two adjacent inner sidewalls 203. However, in another embodiment, the protrusion unit 205 having L-shape horizontal beam structure can have one end connected to the inner sidewall 203 while the other end is disposed in the frame 20 and suspended in midair (not illustrated). In the embodiment of FIG. 3f, the protrusion unit 205 has sector slice structure, and the two sides of the protrusion unit 205 are respectively connected to the two inner sidewalls 203 of the frame 20. The light-emitting element 600 of the backlight module 10 and the flexible circuit board 300 connected to the light-emitting element 600 are disposed at the corner of the two adjacent inner sidewalls 203 of the frame 20; therefore, the protrusion unit 205 of the above embodiments are also disposed at the same corner, so that the protrusion unit 205 can generate fixation and pressing effects for the flexible circuit board 300, so that the light leakage of the light-emitting element 600 disposed on the corresponding places can be decreased.

Figure 4A:
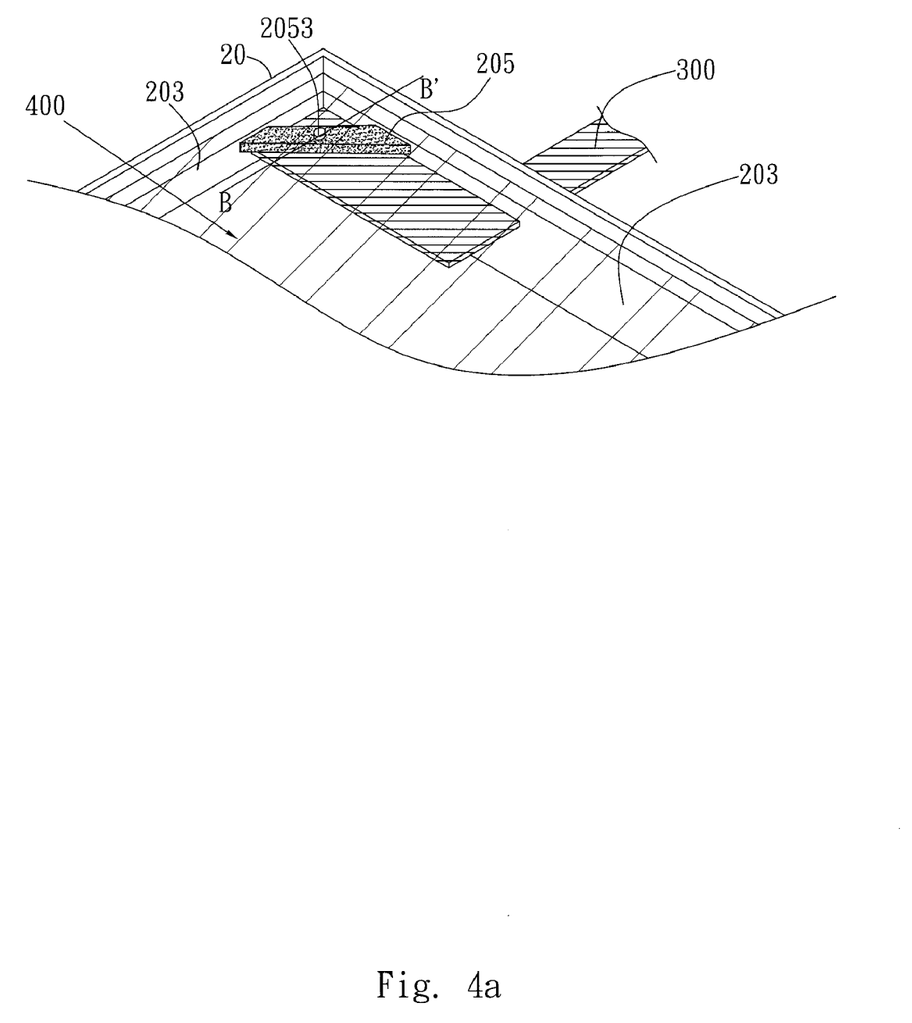
FIG. 4*a* schematically illustrates a partial perspective view of the backlight module of another embodiment of this invention.
Figure 4B:
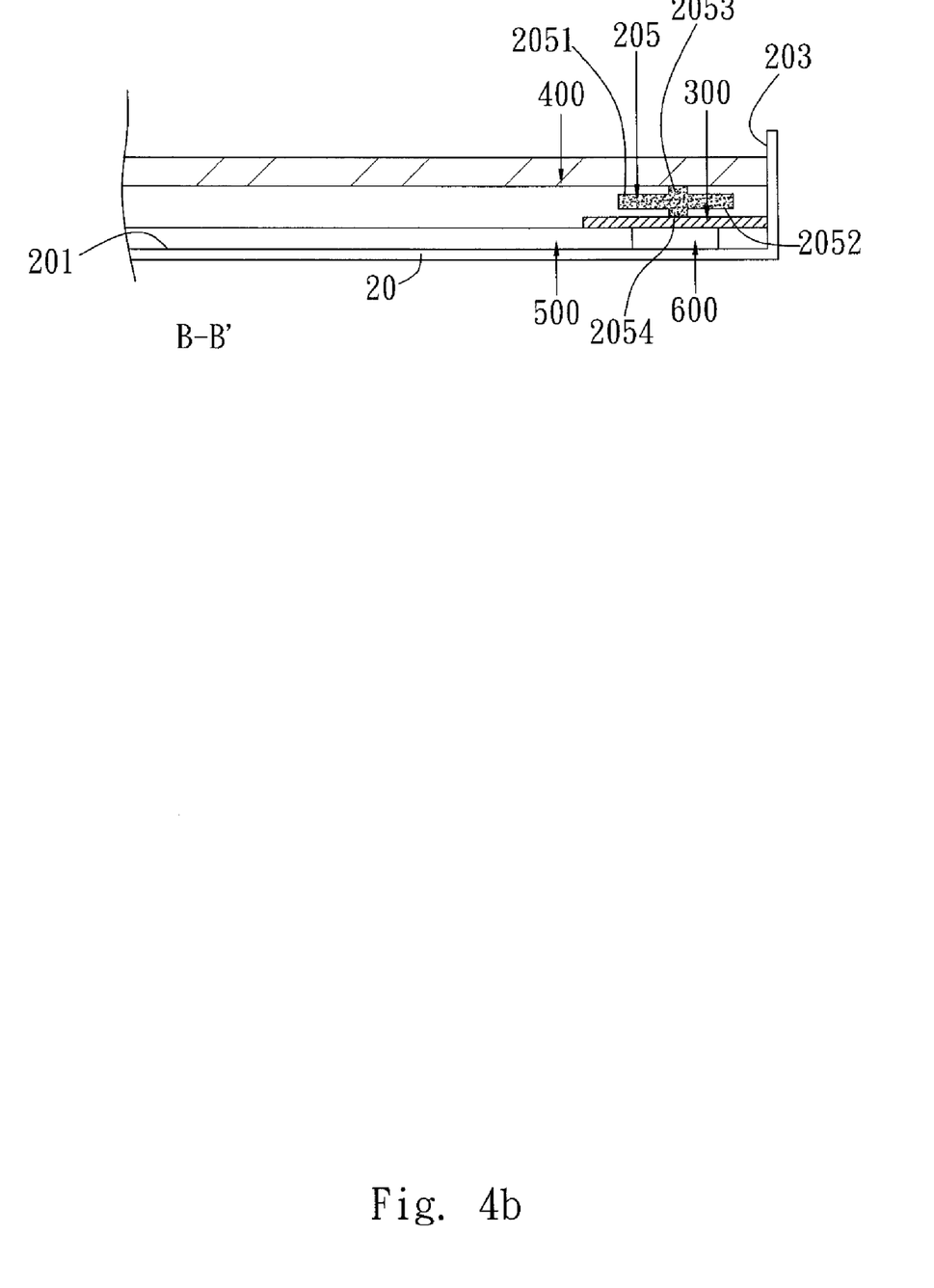
FIG. 4*b* illustrates the side cross-sectional view of FIG. 4*a* as seen from tangent B-B'.

In another embodiment illustrated by FIG. 4a, the protrusion unit 205 further includes a contact point 2053 disposed on the top contact surface 2051 of the protrusion unit 205. The contact point 2053 can be, for example, a salient point illustrated in FIG. 4a or other raised structures. The contact point 2053 can reduce the gap between the substrate 400 and the protrusion unit 205, so that the substrate 400 is further pressed on the protrusion unit 205. Furthermore, in the embodiment illustrated in FIG. 4b, the contact point 2053 is not only disposed on the top contact surface 2051 of the protrusion unit 205, but also on the bottom contact surface 2052 of the protrusion unit 205. The contact point 2054 can decrease the gap between the flexible circuit board 300 and the protrusion unit 205, so that the protrusion unit 205 is further pressed on the flexible circuit board 300. The height of the contact point 2053 and that of the contact point 2054 should be coordinated with the height of the protrusion unit 205. The contact point 2053 and the contact point 2054 should be disposed higher than the flexible circuit board 300 but not higher than the position of the substrate 400, so that when the substrate 400 is pressed on the protrusion unit 205, the substrate 400 will not bend upwards due to the height of the protrusion unit 205 and the contact point 2053. In other embodiments, there could be only one contact point disposed either on the top contact surface 2051 or on the bottom contact surface 2052 of the protrusion unit 205.

In conclusion, this invention uses the protrusion unit 205 disposed on the backlight module 10 to secure the flexible circuit board 300 of the backlight module 10 and the light-emitting element 600 connected beneath thereof in the frame 20, to effectively prevent from leakage caused by slipping or bending of the flexible circuit board 300.

This invention has been described with the above embodiments; however, the above embodiments are only exemplary. What needs to point out is that the disclosed embodiments do not intend to limit the scope of this invention. In other words, the modifications contained in the spirit and the scope of the claims and the equivalents are all included in the scope of this invention.

What is claimed is:

1. a backlight module, comprising:
    a frame, having:
        a bottom surface;
        an inner sidewall protruding out from the bottom surface; and
        a protrusion unit formed on the inner sidewall and protruding out from the inner sidewall; wherein the protrusion unit includes a bottom contact surface; and
        a flexible circuit board disposed under the protrusion unit and in contact with the bottom contact surface;
    wherein the protrusion unit is connected to two adjacent sides of the inner sidewall and forms a hollow area exposing the flexible circuit board.

2. The backlight module of claim 1 further comprising a substrate, wherein the protrusion unit further includes a top contact surface, the substrate presses onto the top contact surface of the protrusion unit to make the protrusion unit press onto the flexible circuit board.

3. The backlight module of claim 1, wherein the protrusion unit includes a horizontal beam structure, a slice rectangular structure, L-shaped horizontal beam structure or sector slice structure.

4. The backlight module of claim 1, wherein the protrusion unit is a cantilever structure.

5. The backlight module of claim 2, wherein the top contact surface of the protrusion unit includes a contact point, and the substrate is pressed onto the protrusion unit by the contact point.

6. The backlight module of claim 5, wherein the contact point is a salient point.

7. The backlight module of claim 2, wherein the bottom contact surface of the protrusion unit includes a contact point, and the protrusion unit is pressed on the flexible circuit board by the contact point.

8. The backlight module of claim 7, wherein the contact point is a salient point.

9. The backlight module of claim 1, wherein the protrusion unit is flexible.

10. The backlight module of claim 1, further comprising a light guiding plate disposed between the bottom surface and the flexible circuit board.

11. The backlight module of claim 1, further comprising a light emitting unit electrically connected to the flexible circuit board; wherein the light emitting unit is disposed under the flexible circuit board and is adjacent to the light guiding plate.

12. The backlight module of claim 11, wherein the position where the light emitting unit and the flexible circuit board are connected corresponds to the position where the protrusion unit is in contact with the flexible circuit board.

* * * * *